(12) United States Patent
Chen

(10) Patent No.: US 7,289,344 B2
(45) Date of Patent: Oct. 30, 2007

(54) REVERSE COUPLING EFFECT WITH TIMING INFORMATION FOR NON-VOLATILE MEMORY

(75) Inventor: Jian Chen, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 41 days.

(21) Appl. No.: 11/271,241

(22) Filed: Nov. 10, 2005

(65) Prior Publication Data
US 2007/0103979 A1  May 10, 2007

(51) Int. Cl.
*G11C 11/18* (2006.01)
(52) U.S. Cl. .................. 365/9; 365/185.33; 365/185.17
(58) Field of Classification Search .................... 365/9, 365/185.33, 185.17, 185.09, 185.29
See application file for complete search history.

(56) References Cited
U.S. PATENT DOCUMENTS

| | | | |
|---|---|---|---|
| 5,758,054 A * | 5/1998 | Katz et al. ..................... | 714/22 |
| 5,815,430 A | 9/1998 | Verhaeghe | |
| 6,312,153 B1 * | 11/2001 | Okada ......................... | 368/47 |
| 6,556,512 B1 * | 4/2003 | Winkler ........................ | 368/47 |

| | | | |
|---|---|---|---|
| 2005/0162913 A1 | 7/2005 | Chen | |

FOREIGN PATENT DOCUMENTS

EP  1329898  7/2003

OTHER PUBLICATIONS

Notice of Allowance dated Jul. 23, 2007, U.S. Appl. No. 11/272,335, filed Nov. 10, 2005.

* cited by examiner

*Primary Examiner*—Richard T. Elms
*Assistant Examiner*—Dang Nguyen
(74) *Attorney, Agent, or Firm*—Vierra Magen Marcus & DeNiro LLP

(57) ABSTRACT

Shifts in the apparent charge stored on a floating gate (or other charge storing element) of a non-volatile memory cell can occur because of the coupling of an electric field based on the charge stored in neighboring floating gates (or other neighboring charge storing elements). The problem occurs most pronouncedly between sets of adjacent memory cells that have been programmed at different times. To compensate for this coupling, the read process for a given memory cell will take into account the programmed state of a neighbor memory cell if the neighbor memory cell was programmed subsequent to the given memory cell. Techniques for determining whether the neighbor memory cell was programmed before or after the given memory cell are disclosed.

29 Claims, 14 Drawing Sheets

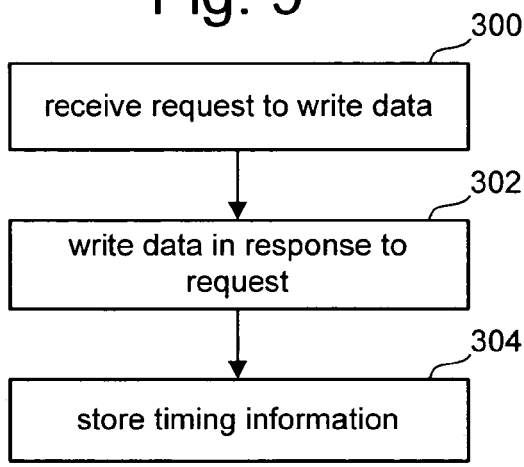
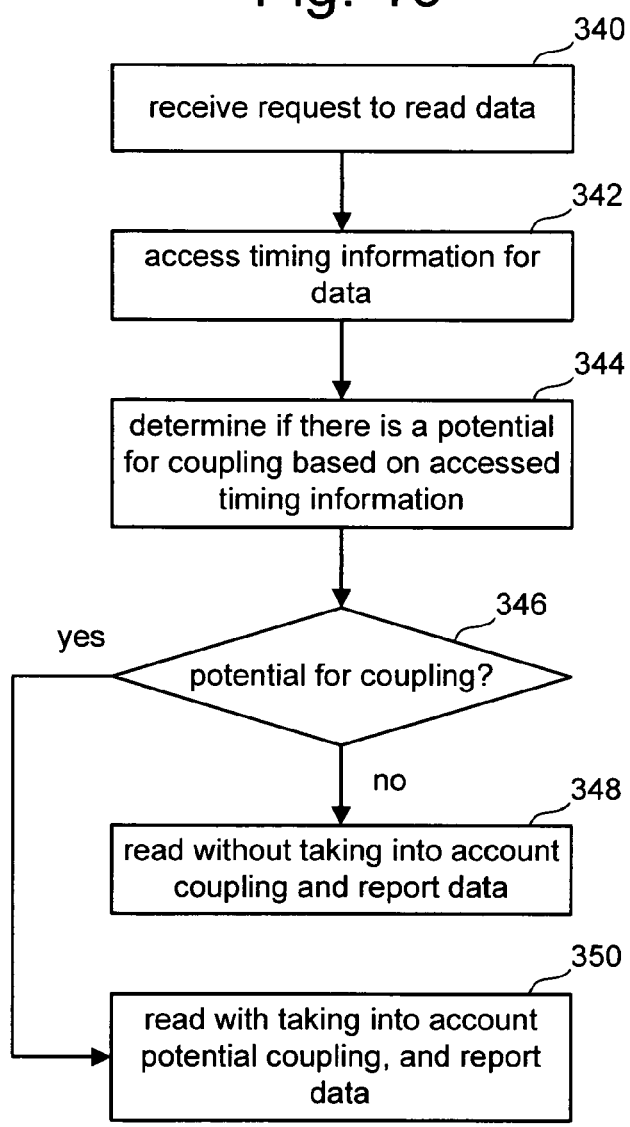

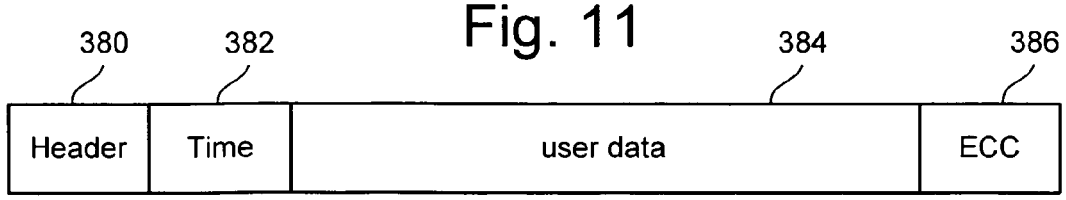
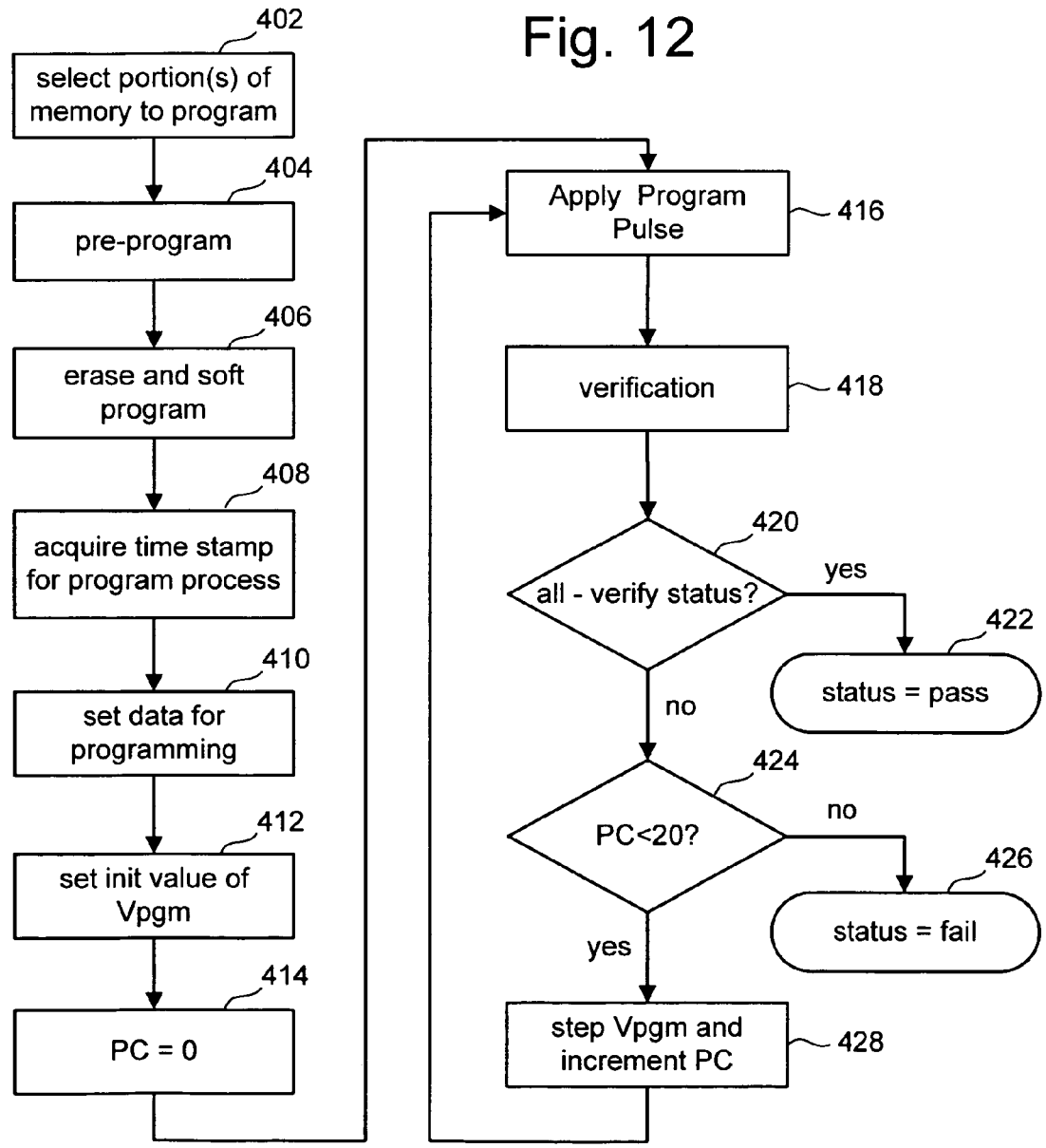

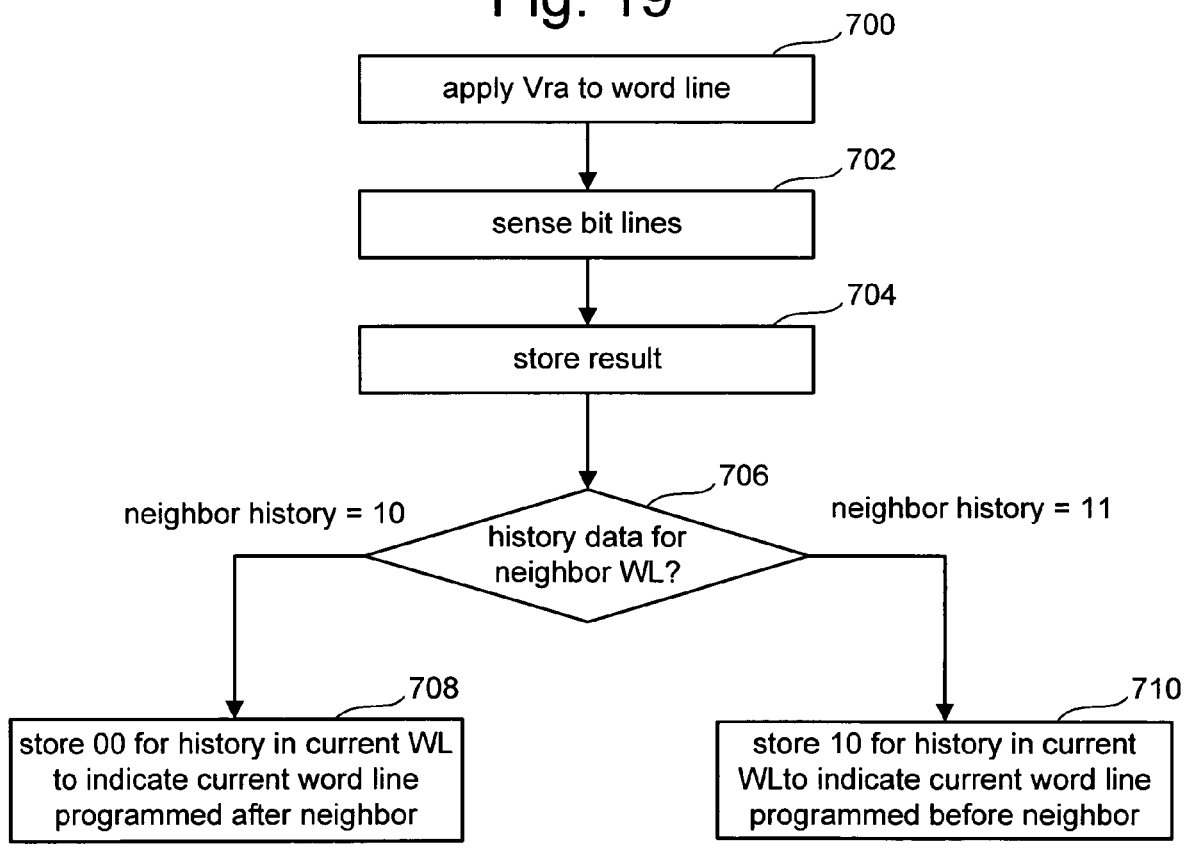

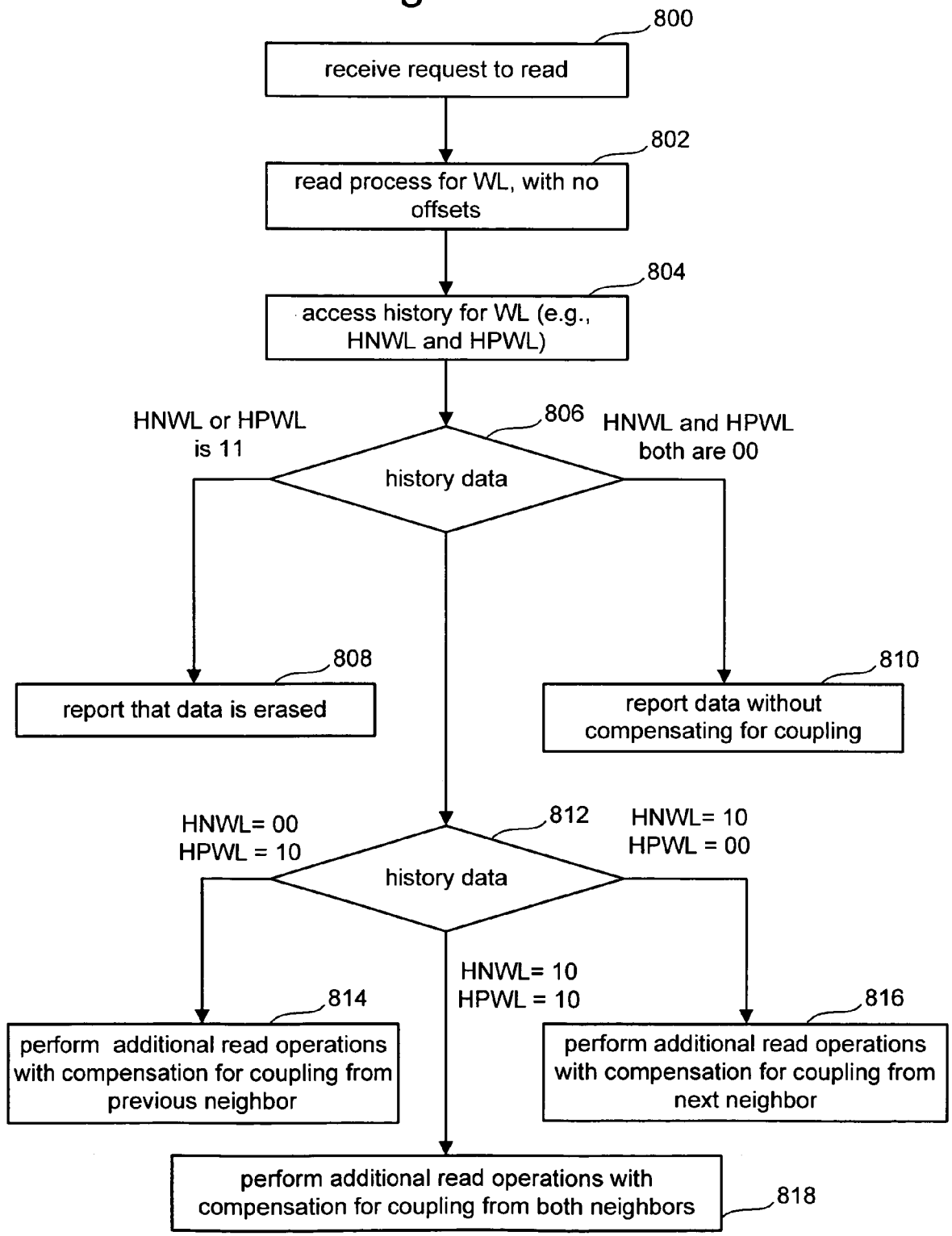

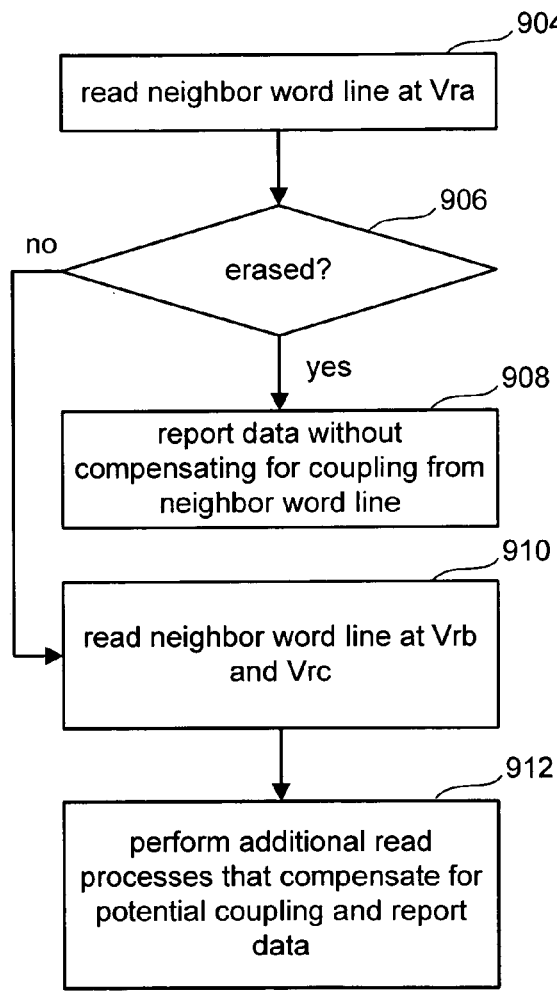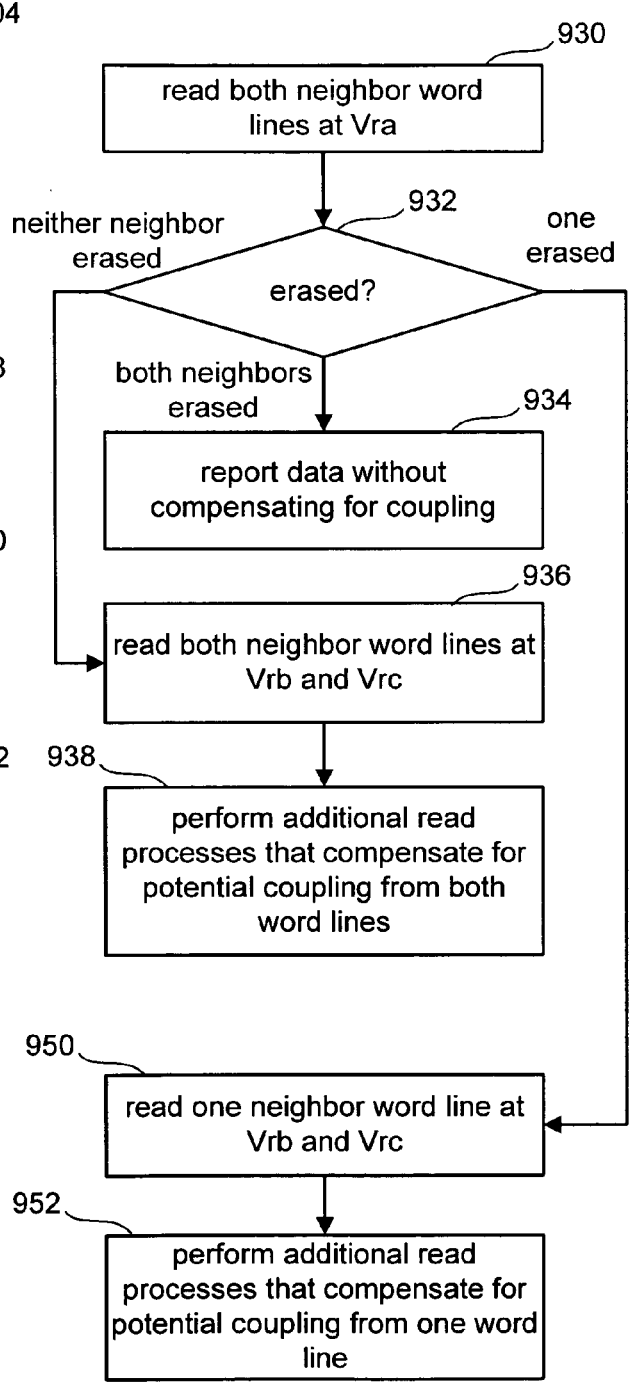

REVERSE COUPLING EFFECT WITH TIMING INFORMATION FOR NON-VOLATILE MEMORY

CROSS-REFERENCE TO RELATED APPLICATIONS

This application is related to co-pending, commonly assigned U.S. patent application Ser. No. 11/272,335, titled "Reverse Coupling Effect with Timing Information," by Jian Chen, filed on the same date herewith, and is incorporated herein by reference in its entirety.

BACKGROUND OF THE INVENTION

1. Field of the Invention

The technology described herein relates to non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397 and in U.S. patent application Ser. No. 10/629,068, titled "Detecting Over Programmed Memory," filed on Jul. 29, 2003; both applications are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored on a floating gate can occur because of the coupling of an electric field based on the charge stored in adjacent or nearby floating gates. This floating gate to floating gate coupling phenomena is described in U.S. Pat. No. 5,867,429, which is incorporated herein by reference in its entirety. Floating gates that may cause coupling to a target floating gate may include floating gates that are on the same bit line, floating gates on the same word line, or floating gates that are across from the target floating gate because they are on both another bit line and another word line.

The floating gate to floating gate coupling phenomena occurs most pronouncedly between sets of memory cells that have been programmed at different times. For example, a first memory cell is programmed to add a level of charge to its floating gate that corresponds to one set of data. Subsequently, one or more neighboring memory cells are programmed to add a level of charge to their floating gates that correspond to a second set of data. After the one or more of the neighboring memory cells are programmed, the charge level read from the first memory cell appears to be different than programmed because of the effect of the charge on the neighboring memory cells being coupled to the first memory cell. The coupling from neighboring memory cells can shift the apparent charge level being read a sufficient amount to lead to an erroneous reading of the data stored.

The effect of the floating gate to floating gate coupling is of greater concern for multi-state devices because in multi-state devices the allowed threshold voltage ranges and the forbidden ranges are narrower than in binary devices.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states This effect is much more significant for multi-state memories than memories using only two states (binary memories). Furthermore, the reduction of the space between word lines and of the space between bit lines will also increase the coupling between adjacent floating gates.

SUMMARY OF THE INVENTION

To compensate for coupling between adjacent floating gates, the read process for a given memory cell will take into account the programmed state of an neighbor memory cell if the neighbor memory cell was programmed subsequent to the given memory cell. Techniques for determining whether the neighbor memory cell was programmed before or after the given memory cells are disclosed.

One embodiment includes accessing stored timing information that is customized for a set of data stored in one or more non-volatile storage elements and reading the set of data from the one or more non-volatile storage elements. The reading of the data includes selectively compensating for one or more potential errors in the set of data based on the timing information.

One example implementation includes a plurality of non-volatile storage elements, a set of word lines connected to the non-volatile storage elements, and one or more managing circuits in communication with said non-volatile storage elements. The one or more managing circuits program data to the non-volatile storage elements in a word line order that is not predefined. The programming includes storing timing information for the data. The one or more managing circuits read the data from the non-volatile storage system including compensating for coupling between non-volatile storage elements if the stored timing information indicates that neighboring non-volatile storage elements were potentially programmed later in time than non-volatile storage elements storing the data.

BRIEF DESCRIPTION OF THE DRAWINGS

FIG. 9 is a flow chart describing one embodiment of a process for programming non-volatile memory.

FIG. 10 is a flow chart describing one embodiment of a process for reading non-volatile memory.

FIG. 11 is a block diagram depicting one page (or other unit) of data.

FIG. 12 is a flow chart describing one embodiment of a process for programming non-volatile memory.

FIG. 17 is a chart describing history data.

FIG. 19 is a flow chart describing one embodiment of a process for determining history data.

FIG. 20 is a flow chart describing one embodiment of a process for reading non-volatile memory.

FIG. 21 is a flow chart describing one embodiment of a process for performing read operations that take into account coupling from neighboring memory cells.

FIG. 22 is a flow chart describing one embodiment of a process for performing read operations that take into account coupling from neighboring memory cells.

DETAILED DESCRIPTION

Figure 1:
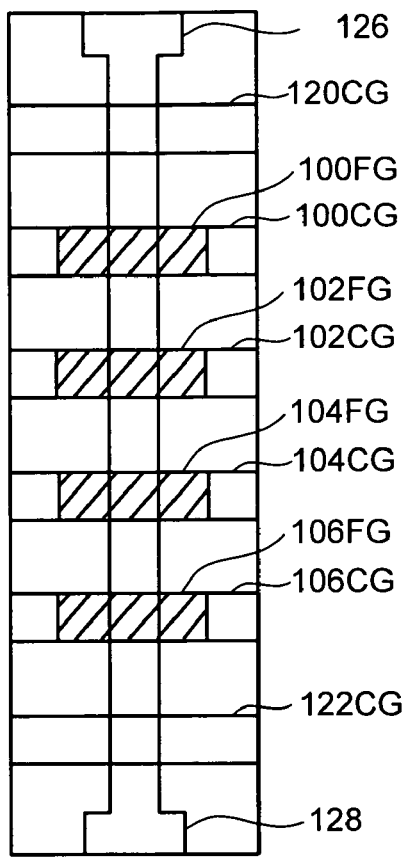
FIG. 1 is a top view of a NAND string.
Figure 2:
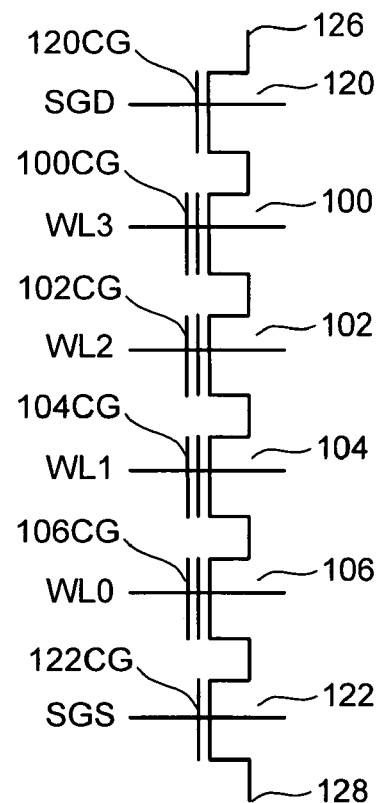
FIG. 2 is an equivalent circuit diagram of the NAND string.

One example of a non-volatile memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 connects the NAND string to bit line contact 126. Select gate 122 connects the NAND string to source line contact 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
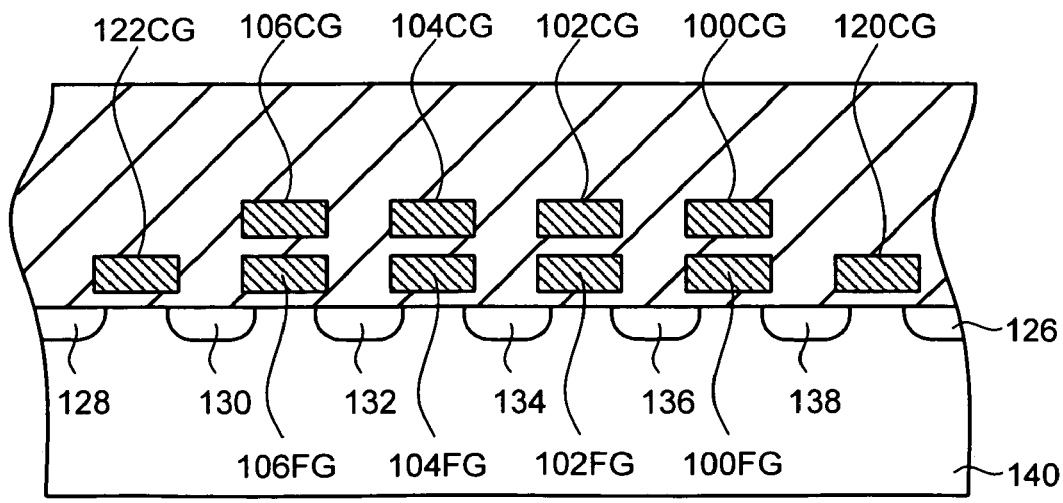
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell can be divided into two ranges, which are assigned logical data "1" and "0." In one example of a NAND flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. patents/ patent applications, all of which are incorporated herein by reference in their entirety: U.S. Pat. Nos. 5,570,315; 5,774, 397; 6,046,935; 5,386,422; 6,456,528; and U.S. patent application Ser. No. 09/893,277 (Publication No. US2003/ 0002348). Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also experience coupling between neighboring memory cells Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543- 545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
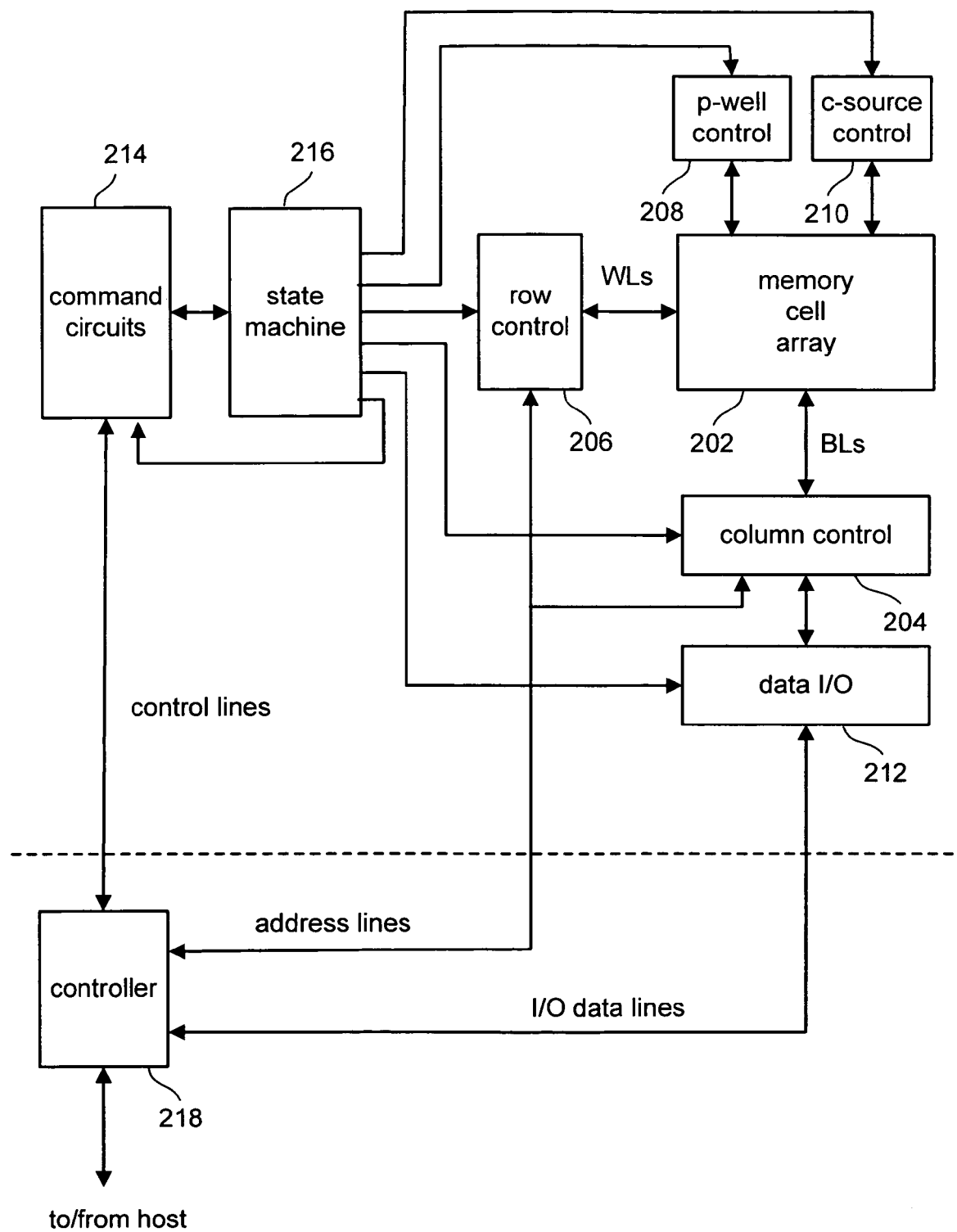
FIG. 4 is a block diagram of a non-volatile memory system.

FIG. 4 is a block diagram of one embodiment of a flash memory system. Memory cell array 202 is controlled by column control circuit 204, row control circuit 206, c-source control circuit 210 and p-well control circuit 208. Column control circuit 204 is connected to the bit lines of memory cell array 202 for reading data stored in the memory cells, for determining a state of the memory cells during a program operation, and for controlling potential levels of the bit lines to promote the programming or to inhibit the programming. Row control circuit 206 is connected to the word lines to select one of the word lines, to apply read voltages, to apply program voltages and to apply an erase voltage. For example, program voltage levels used in EPROM and flash memory circuits are higher than the voltages normally used in memory circuits. They are often higher than the voltage supplied to the circuit. These higher voltages are preferably produced by a charge pump in row control circuit 206 (or elsewhere), which in one example essentially dumps charge into the capacitive wordline to charge it to a higher voltage. The charge pump receives an input at a voltage $V_{in}$ and provides an output at a higher voltage $V_{out}$ by boosting the input voltage progressively in a series of voltage multiplier stages. The voltage output is supplied to a load, for example the word line of an EPROM memory circuit. In some implementations, there is a feedback signal from the load to the charge pump. The conventional prior art pump turns off in response to a signal indicating that the load has reached a predetermined voltage. Alternatively, a shunt is used to prevent overcharging once the load reaches the predetermined voltage. However, this consumes more power and is undesirable in low power applications. More information about charge pumps can be found in U.S. Pat. No. 6,734,718, incorporated herein by reference in its entirety.

C-source control circuit 210 controls a common source line (labeled as "C-source" in FIG. 5) connected to the memory cells. P-well control circuit 208 controls the p-well voltage.

The data stored in the memory cells are read out by the column control circuit 204 and are output to external I/O lines via data input/output buffer 212. Program data to be stored in the memory cells are input to the data input/output buffer 212 via the external I/O lines, and transferred to the column control circuit 204. The external I/O lines are connected to controller 218.

Command data for controlling the flash memory device is input to controller 218. The command data informs the flash memory of what operation is requested. The input command is transferred to state machine 216, which controls column control circuit 204, row control circuit 206, c-source control 210, p-well control circuit 208 and data input/output buffer 212. State machine 216 can also output status data of the flash memory such as READY/BUSY or PASS/FAIL. In some embodiments, state machine 216 is responsible for managing the programming process, including the processes depicted in the flow charts described below.

Controller 218 is connected or connectable with a host system such as a personal computer, a digital camera, personal digital assistant, etc. Controller 218 communicates with the host in order to receive commands from the host, receive data from the host, provide data to the host and provide status information to the host. Controller 218 converts commands from the host into command signals that can be interpreted and executed by command circuits 214, which is in communication with state machine 216. Controller 218 typically contains buffer memory for the user data being written to or read from the memory array. In some embodiments, the programming process can be managed by the controller.

One exemplar memory system comprises one integrated circuit that includes controller 218, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller (or control capability) can be embedded in the host or included within a removable memory system.

In some implementations, some of the components of FIG. 4 can be combined. In various designs, one or more of the components of FIG. 4 (alone or in combination), other than memory cell array 202, can be thought of as a managing circuit. For example, one or more managing circuits may include any one of or a combination of a command circuit, a state machine, a row control circuit, a column control circuit, a well control circuit, a source control circuit or a data I/O circuit.

Figure 5:
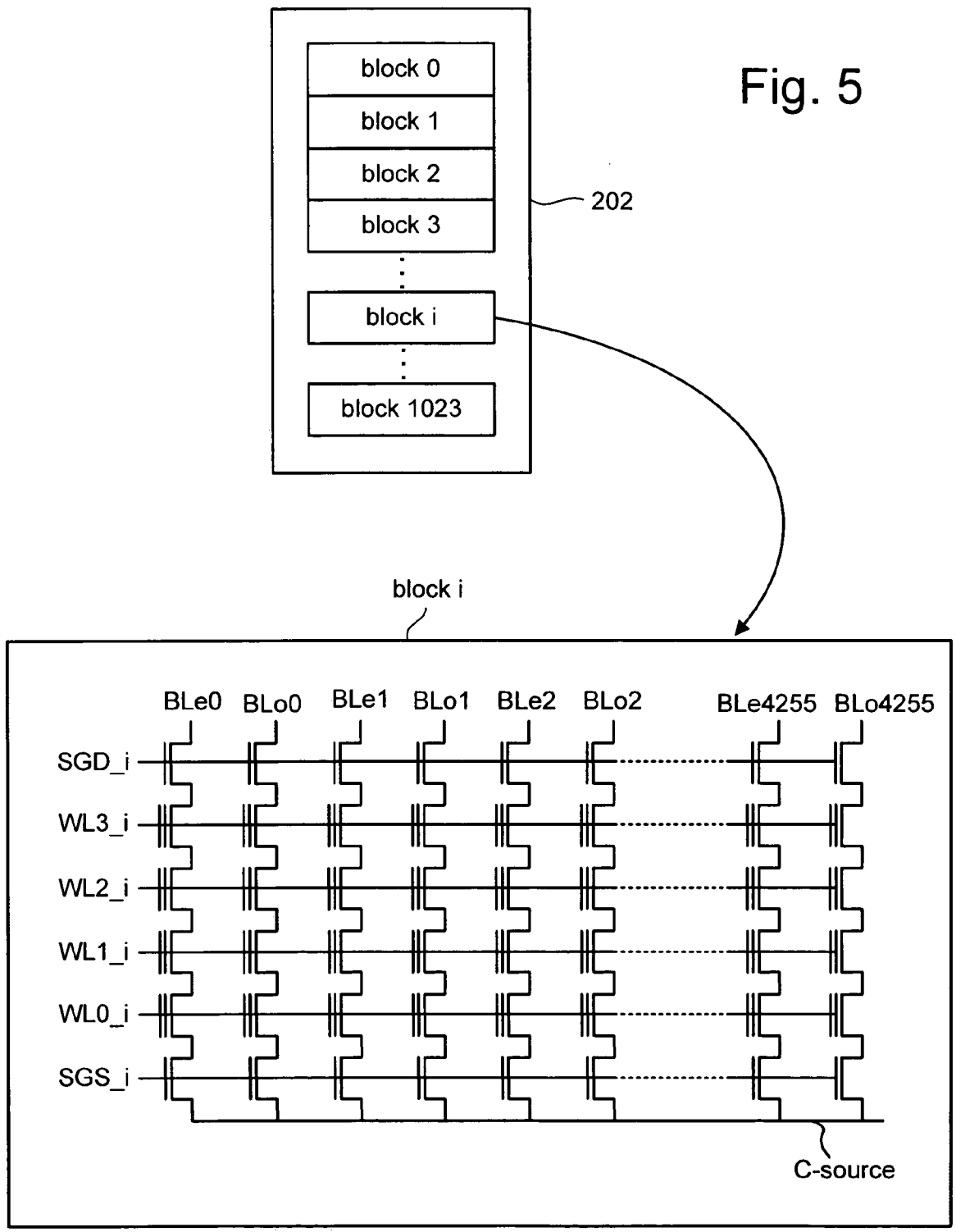
FIG. 5 is a block diagram of a non-volatile memory array.

With reference to FIG. 5, an example structure of memory cell array 202 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 5 shows four memory cells connected in series to form a NAND string. Although four cells are shown to be included in each NAND string, more or less than four memory cells can be used. One terminal of the NAND string is connected to corresponding bit line via a select transistor SGD, and another terminal is connected to c-source via a second select transistor SGS.

During one embodiment of read and programming operations, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 4 and 5 can also be used to implement the present invention. For example, in one embodiment the bit lines are not divided into odd and even bit lines so that all bit lines are programmed and read concurrently (or not concurrently).

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In the read and verify operations, the select gates (SGD and SGS) and the unselected word lines (e.g., WL0, WL2 and WL3) are raised to a read pass voltage (e.g. 4.5 volts) to make the transistors operate as pass gates. The selected word line (e.g. WL1) is connected to a voltage, a level of which is specified for each read and verify operation in order to determine whether a threshold voltage of the concerned memory cell is above or below such level. For example, in a read operation for a two level memory cell, the selected word line WL1 may be grounded, so that it is detected whether the threshold voltage is higher than 0V. In a verify operation for a two level memory cell, the selected word line WL1 is connected to 0.8V, for example, so that it is verified whether or not the threshold voltage has reached at least 0.8V. The source and p-well are at zero volts. The selected bit lines (BLe) are pre-charged to a level of, for example, 0.7V. If the threshold voltage is higher than the read or verify level on the word line, the potential level of the bit line (BLe) associated with the cell of interest maintains the high level because of the non-conductive memory cell. On the other hand, if the threshold voltage is lower than the read or verify level, the potential level of the concerned bit line (BLe) decreases to a low level, for example less than 0.5V, because of the conductive memory cell discharging the bitline. The state of the memory cell is thereby detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one embodiment, a page is a unit of programming. In some implementations, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller calculates the ECC when data is being programmed into the array, and also checks it when data is being read from the array. Alternatively, the ECCs and/or other overhead data are stored in different pages, or even different blocks, than the user data to which they pertain. In other embodiments, other parts of the memory device (e.g., state machine) can calculate the ECC.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages.

Figure 6:
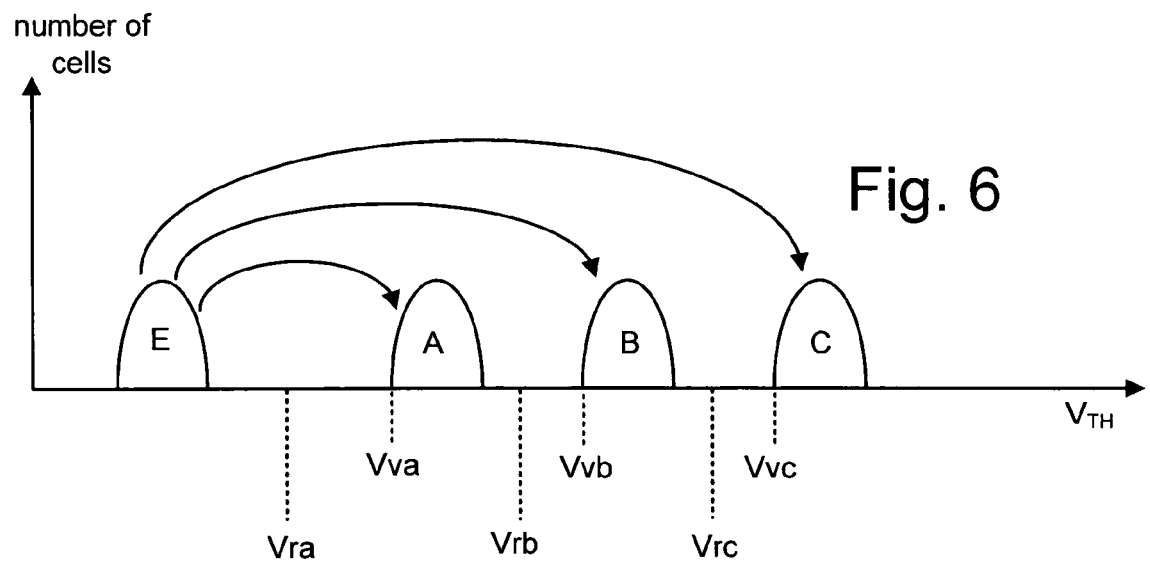
FIG. 6 depicts an example set of threshold voltage distributions.

FIG. 6 illustrates threshold voltage distributions for the memory cell array when each memory cell stores two bits of data. FIG. 6 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 6 corresponds to predetermined values for the set of data bits. The specific relationship between the data programmed into the memory cell and the threshold voltage levels of the cell depends upon the data encoding scheme adopted for the cells. One example assigns "11" to threshold voltage range E (state E), "10" to threshold voltage range A (state A), "00" to threshold voltage range B (state B) and "01" to threshold voltage range C (state C). However, in other embodiments, other schemes are used.

FIG. 6 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 6 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C (as depicted by the curved arrows). For example, a population of memory cells to be programmed may first be erased so that all memory cells in the population are in erased state E. While some memory cells are being programmed from state E to state A, other memory cells are being programmed from state E to state B and/or from state E to state C.

Figure 7:
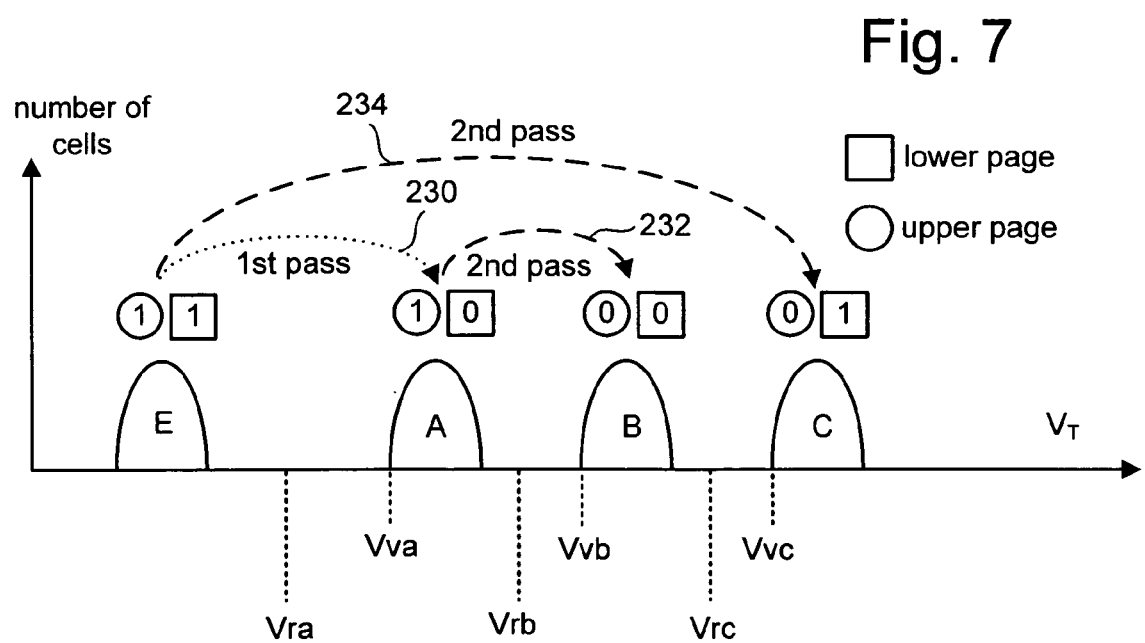
FIG. 7 depicts an example set of threshold voltage distributions.

FIG. 7 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 230. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 234. If the cell had been programmed into state A as a result of the first programming pass, then the memory cell is further programmed in the second pass so that the threshold voltage is increased to be within state B, as depicted by arrow 232. The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 8A:
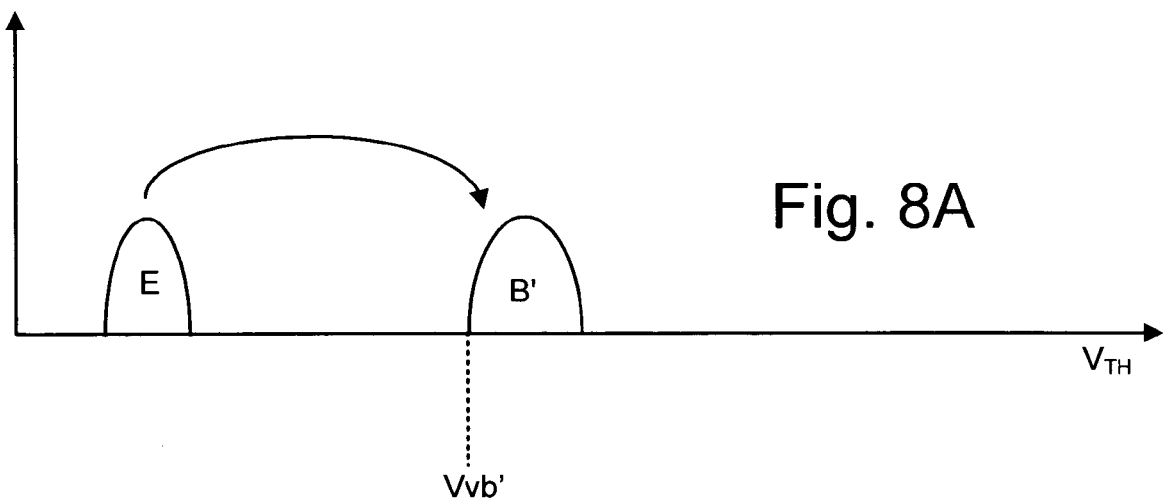
FIGS. 8A-C show various threshold voltage distributions and describe a process for programming non-volatile memory.
Figure 8B:
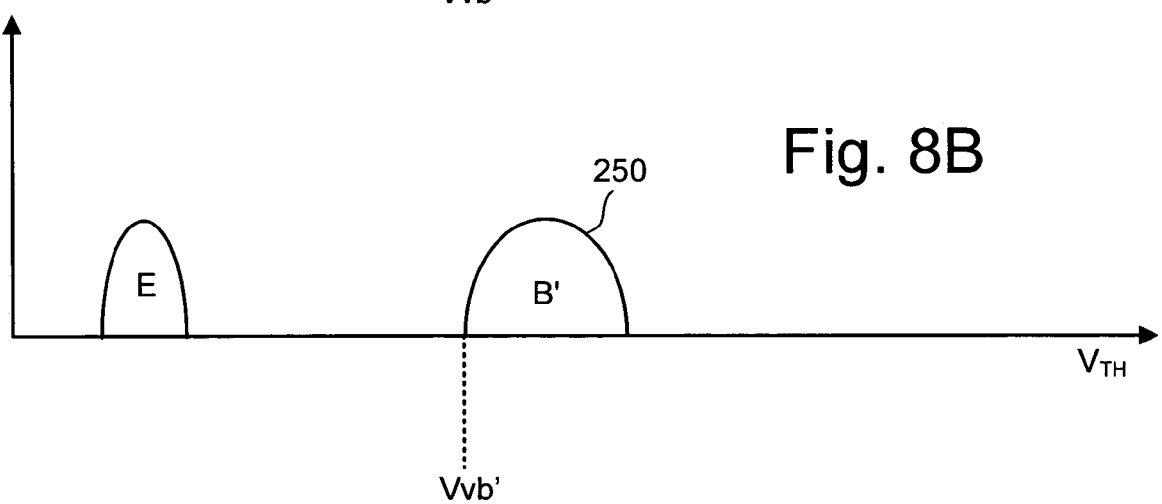
Figure 8C:
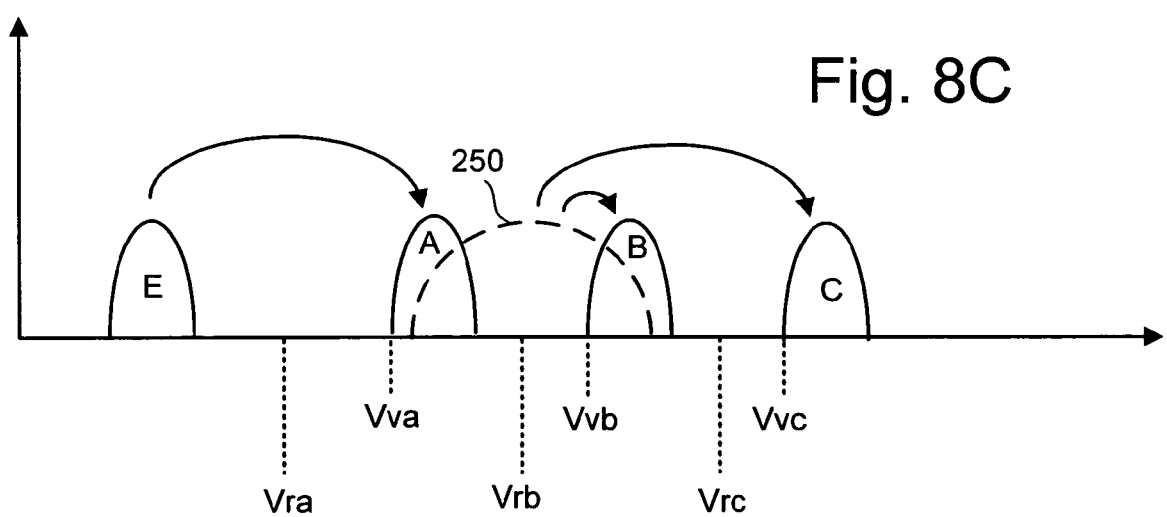

FIGS. 8A-C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIG. 8, the upper page stores bit 0 and the lower page stores bit 1. With reference to state B, the upper page stores bit 1 and the lower page stores bit 0. With reference to state C, both pages store bit data 0.

The programming process of FIGS. 8A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell on an adjacent word line will then be programmed with respect to its lower page. After programming the neighbor memory cell, the floating gate to floating gate coupling effect will raise the apparent threshold voltage of memory cell under consideration, which is in state B'. This will have the effect of widening the threshold voltage distribution for state B' to that depicted as threshold voltage distribution 250 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 250 and the upper page data is to remain at 1, then the memory cell will be programmed to final state B. If the memory cell is in intermediate threshold voltage distribution 250 and the upper page data is to become data 0, then the threshold voltage of the memory cell will be raised so that the memory cell is in state C.

The process depicted by FIGS. 8A-C reduces the effect of floating gate to floating gate coupling because only the upper page programming of neighbor memory cells will have an effect on the apparent threshold voltage of a given memory cell. An example of an alternate state coding is to move from distribution 250 to state C when the upper page data is a 1, and to move to state B when the upper page data is a 0. Although FIGS. 9A-C provide an example with respect to four data states and two pages of data, the concepts taught by FIGS. 8A-C can be applied to other implementations with more or less than four states and different than two pages. More detail about various programming schemes and floating gate to floating gate coupling can be found in U.S. patent application Ser. No. 11/099,133, titled "Compensating For Coupling During Read Operations Of Non-Volatile Memory," filed on Apr. 5, 2005; and U.S. Pat. No. 6,657,891, issued on Dec. 2, 2003 to Shibata et al., both of which are incorporated herein by reference in their entirety.

As described above, neighboring memory cells may cause coupling which can affect the apparent threshold voltage of a memory cell. A neighboring memory cell could be on an adjacent word line, an adjacent bit line, a bit line that may not be adjacent but is close-by, or a word line that may not be adjacent but is close-by. The system will selectively compensate for coupling between neighboring floating memory cells by first determining whether there is potential for coupling because the memory cell (or floating gate) being read was programmed prior to the neighboring memory cell (or floating gate) being programmed. If the memory cell being read was programmed prior to the neighboring memory cell, then a process can be used to compensate for the coupling based on the level of programming of the neighboring memory cell.

FIG. 9 is a flow chart describing one embodiment of a high level process for programming that includes making use of the timing information. FIG. 10 is a flow chart describing one embodiment of a process for reading that makes use of the timing information programmed in order to determine whether there's a potential for coupling and then selectively compensating based therein.

In step 300 of FIG. 9, a request to write data is received. This request can be received at the controller, the state machine, or another device. In response to that request, data (one or more bits of information) is written to the flash memory array in step 302. Additionally, timing information is stored in step 304. The timing information is customized for the data written in step 302. In one embodiment, the timing information is stored with the data stored in step 302. In other embodiments, the timing information is stored separately. Steps 302 and 304 can be performed concurrently or separately (in either order). Note that in all of the flow charts included with this document, the order of steps depicted in the flow chart is not necessarily a requirement, and in many cases other suitable orders may also be performed.

There are many examples of timing information that can be used. In one embodiment, a time stamp is used. This time stamp can be an absolute time stamp that is read from the system clock for the host device. In another embodiment, the memory system could include an internal battery and store its own clock. In another embodiment, a relative time stamp can be used. For example, a system can maintain a cycle count. The cycle count will number each programming cycle. The cycle count can be maintained by the state machine, the controller or another device. The cycle count can be stored as timing information in step 304. If a first set of data has a cycle count that is greater than a second set of data, then the first set of data was programmed after the second set of data. Another embodiment of timing information could include an indication of whether data is programmed before or after neighboring memory cells.

FIG. 10 provides a flow chart describing a process for reading data. In step 340, a request to read data is received by the controller, state machine, or other device. In step 342, timing information for the data is accessed. This is the timing information that was stored in step 304. In step 344, it is determined whether there is a potential for coupling based on the accessed timing information. In one embodiment, the system determines whether the timing information indicates that the memory cells storing the data associated with the read request were programmed before neighboring memory cells. If so, then there is a potential for coupling between memory cells. If the memory cells storing the data associated with the read request were programmed after programming the neighboring cells, there is not likely to be a potential for coupling. If step 344 determines that there is a potential for coupling, there still may not be any actual coupling if the level of programming of the neighboring cells is not sufficient to create the requisite coupling. If there's no potential for coupling (step 346), then the read process is performed without taking into account coupling in step 348. Note that the read process includes determining the information stored in the non-volatile memory and reporting that information. If it is determined that there is a potential for coupling (step 346), then a read process is performed that takes into account potential coupling in step 350. In one embodiment, step 350 includes compensating for the coupling, if necessary. There are many different schemes for compensating for coupling between memory cells. Any suitable scheme can be used with the technology described herein.

FIG. 11 is a block diagram describing one embodiment of a page of data. The page of data includes header 380, timing information 382, user data 384, and error correction codes (ECC) 386. Header information 380 can include any set of data known in the art to be used in headers. Some examples of header information include address information, bit and/or sector mapping related information, counts of number of writes to the sector, etc. Other information can also be stored in the header. Timing information 382 is the timing information stored in step 304. User data 384 includes the data written in step 302. ECC 386 includes error correction codes known in the art. Note that some write requests may require writing to multiple pages. In that case, one or more than one set of timing information can be used.

FIG. 12 is a flow chart describing one embodiment of a process for writing data. The process of FIG. 12 is one embodiment for performing steps 302 and 304 of FIG. 9. In step 402 of FIG. 12, the system will select the appropriate portions of memory to program in response to receiving a request to write data. This may include selecting a block and/or page and/or sector to write to. In one embodiment, the process of FIG. 12 writes data to a page, which includes writing data to memory cells connected to a common word line. In step 404, the selected portion of memory is pre-programmed, which provides for even wearing of the flash memory. All memory cells in the chosen sector or page are programmed to the same threshold voltage range. Step 404 is an optional step. In step 406, the memory cells to be programmed are then erased. For example, step 406 can include moving old memory cells to state E (see FIG. 6-8). In some embodiments, step 406 also includes performing a soft programming process. During the erase process, it is possible that some of the memory cells have their threshold voltages lowered to a value that is below the distribution E (see FIG. 6-8). The soft programming process will apply program voltage pulses to memory cells so that their threshold voltages will increase to be within threshold voltage distribution E.

In step 408, the system will acquire a time stamp. The time stamp can be an absolute time. For example, the memory system could request the date/time from the host via the controller. Alternatively, the memory system could include a battery and an internal clock so that the memory system can provide its own time stamp. In another embodiment, the memory system could maintain a cycle count. Each time the system programs a page, the cycle count will be incremented. The time stamp acquired in step 408 would be the current cycle count. While the cycle count does not provide absolute time, it does provide relative time. With cycle counts, it is possible to determine which of two or more pages were programmed first.

In step 410, data to be programmed is stored in the appropriate latches/registers. In one embodiment, the process of FIG. 12 will be used to program one page of data. All of the memory cells being programmed are on the same word line. Each memory cell will have its own bit line and a set of latches associated with that bit line. These latches will store indications of the data to be programmed for the associated memory cell. Step 410 also includes storing the time stamp data into the latches associated with the bit lines for the memory cells that will store the time stamp. In step 412, the magnitude of the first program pulse is set. In some embodiments, the voltage applied to the word lines is a set of program pulses, with each pulse increasing in magnitude from the previous pulse by a step size (e.g., 0.2v-0.4v). In step 414, the program count PC will be set to initially be zero.

In step 416, a program pulse is applied to the appropriate word line(s). In step 418, the memory cells on that word line(s) are verified to see if they have reached the target threshold voltage level. If all the memory cells have reached the target threshold voltage level (step 420), then the programming process has completed successfully (status=pass) in step 422. If not all the memory cells have been verified, then it is determined in step 424 whether the program count PC is less than 20 (or another suitable value). If the program count is not less than 20, then the programming process has failed (step 426). If the program count is less than 20, than in step 428, the magnitude of program voltage signal Vpgm is incremented by the step size (e.g. 0.3v) for the next pulse and the program count PC is incremented. Note that those memory cells that have reached their target threshold voltage are locked out of programming for the remainder of the current programming cycle. After step 428, the process of FIG. 12 continues at step 416 and the next program pulse is applied.

Figure 13:
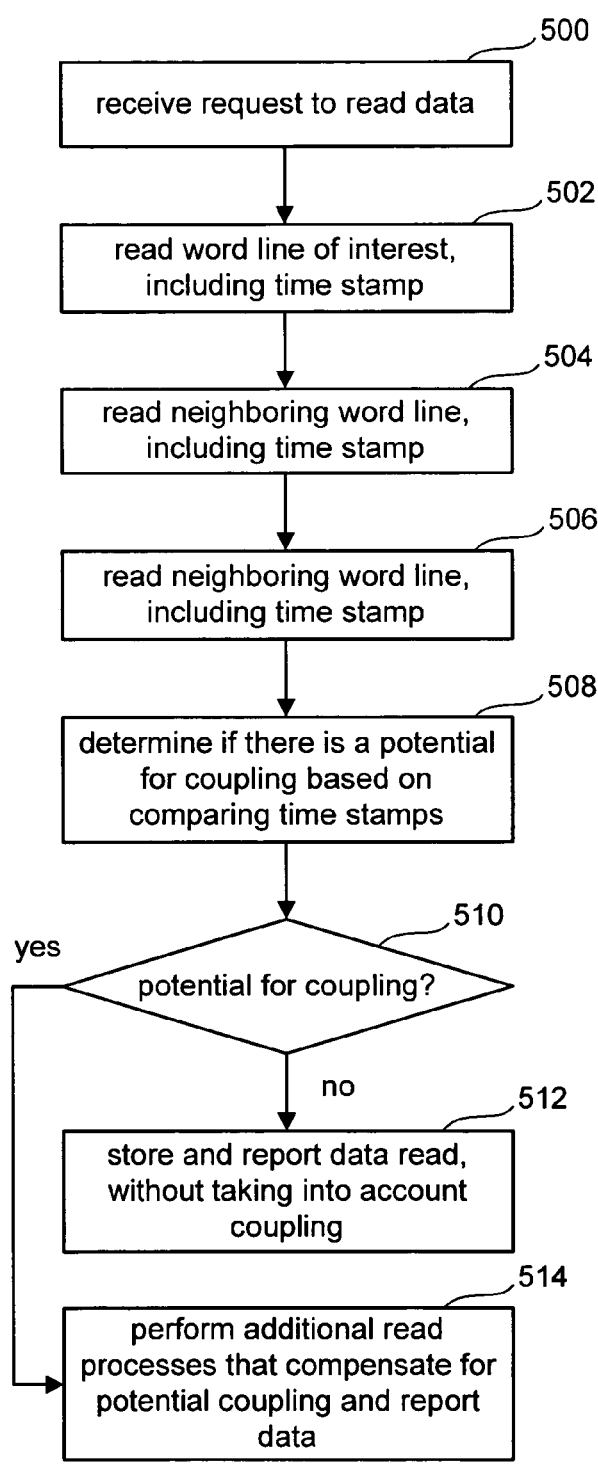
FIG. 13 is a flow chart describing one embodiment of a process for reading non-volatile memory.

FIG. 13 provides one example of a process for reading data that has been written according to the process of FIG. 12, or according to other processes. FIG. 13 is an embodiment of the process of FIG. 10. In step 500 of FIG. 13, a request to read data is received. In step 502, a read process is performed for the page requested. In one embodiment, this includes reading data from a set of memory cells connected to the same word line. In some embodiments, each word line will have two adjacent word lines (e.g., one word line above and one word line below, or one word line to the left and one word line to the right). In step 504, one of the adjacent word lines is read. In step 506, the other adjacent word line is read. In embodiments where the word line storing the data of interest only includes one adjacent word line, then step 506 can be skipped. Note that steps 502, 504, and 506 include reading the associated timing information in addition to the user data. That is the entire page depicted in FIG. 11 is read, and that page includes timing information 382. The embodiment of FIG. 13 assumes that the timing information is some type of time stamp such as an absolute time or relative time (e.g., cycle count). In step 508, it is determined whether there's a potential for coupling based on comparing the various time stamps. For example, if the time stamp for the word line being read is later than the time stamp of the two adjacent word lines, then it is assumed that the word line being read was programmed subsequent to the two adjacent word lines and there is no potential for floating gate to floating gate coupling. If the time stamp of the word line being read is earlier than the time stamp for either of the two adjacent word lines then there's a potential for coupling. If there's no potential for coupling (step 510), then the data read in step 502 is stored and reported to the user without taking into account any compensation for coupling. If it is determined that there is a potential for coupling (step 510), then in step 514 additional read processes are performed that compensate for the coupling in step 514.

Figure 14:
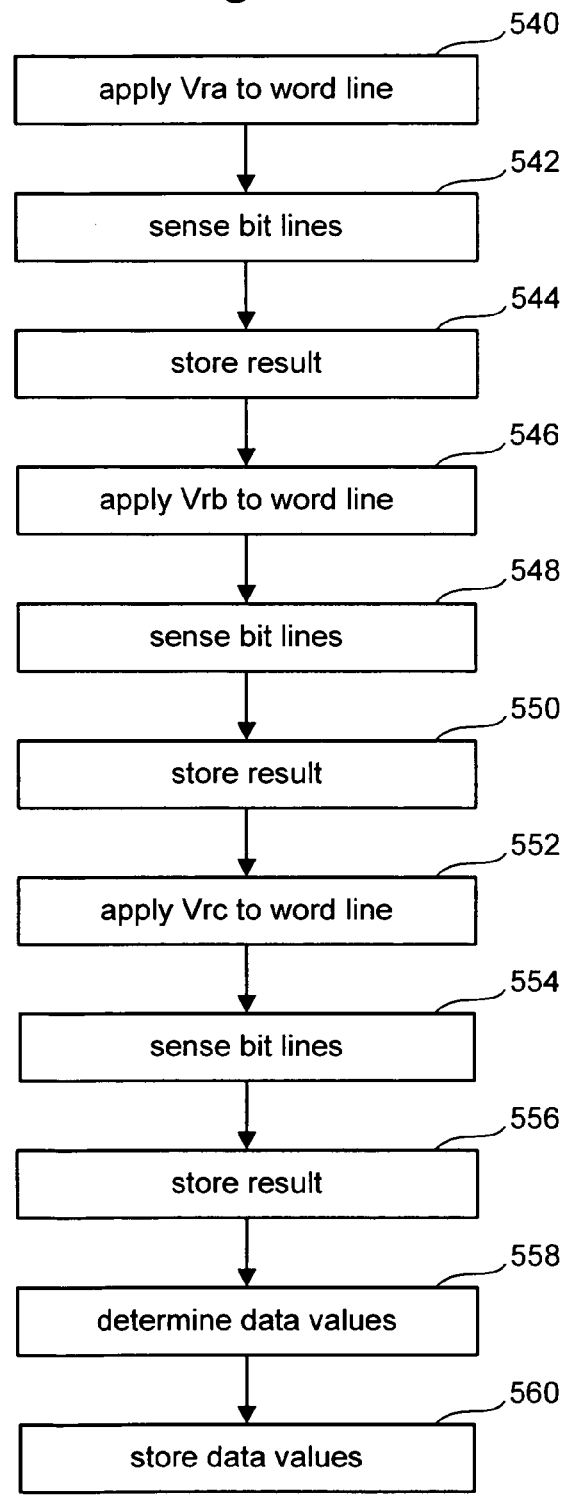
FIG. 14 is a flow chart describing one embodiment of a process for reading memory cells on a word line, without using offsets to compensate for coupling.

FIG. 14 is a flow chart describing one embodiment of a process for performing a read operation for a page of data (see step 502 of FIG. 13). The embodiment of FIG. 14 pertains to reading a page of data from a set of memory cells connected to a common word line. The specific embodiment of FIG. 14 pertains to multi-state memory including four states such as states E, A, B, and C of FIGS. 6-8. The technology of FIG. 14 can also apply to other configurations. In step 540, read reference voltage Vra is applied to the appropriate word line associated with the page. In step 542, the bit lines associated with the page are sensed to determine whether the addressed memory cells conduct or do not conduct based on the application of Vra to their control gates. Bit lines that conduct indicate that the memory cells were turned on; therefore, the threshold voltages of those memory cells are below Vra (e.g., in state E). In step 544 the result of the sensing for the bit lines is stored in the appropriate latches for the bit lines. In step 546, read reference voltage Vrb is applied to the word line associated with the page being read. In step 548, the bit lines are sensed as described above. In step 550, the results are stored in the appropriate latches for the bit lines. In step 552, read reference voltage Vrc is applied to the word line associated with the page. In step 554, the bit lines are sensed to determine which memory cells conduct, as described above. In step 556, the results from the sensing step are stored in the appropriate latches for the bit lines. In step 558, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by a processing unit associated with the sense amps. In step 560, the determined data values are stored in the appropriate latches for each bit line, or elsewhere, to be used by the state machine, controller or other device. In other embodiments, sensing the various levels (Vra, Vrb, and Vrc) may occur in different orders.

Figure 15A:
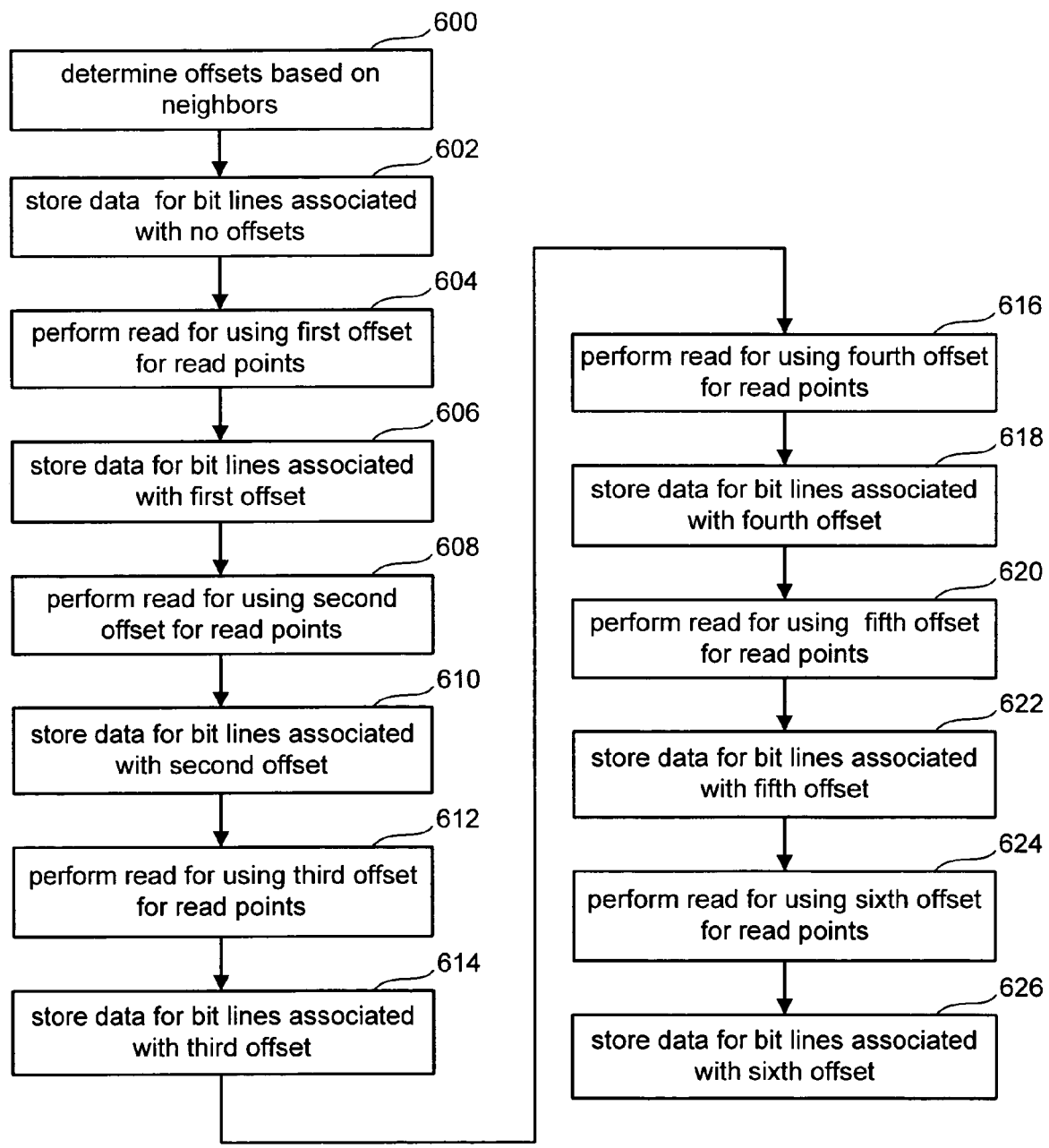
FIG. 15A is a flow chart describing one embodiment of a process for reading memory cells on a word line, using offsets to compensate for coupling.

FIG. 15A provides a flowchart describing one embodiment of a process for performing additional read processes that compensate for potential coupling. Thus, FIG. 15A provides one embodiment of step 514 of FIG. 13. The embodiment of FIG. 15A assumes that there is a potential coupling from two neighboring word lines. In step 600, the system determines offsets based on each of the neighbors. There are many different types of offsets and values for the offsets that can be used. In one embodiment, if a neighbor memory cell was programmed to State A (see FIG. 6), then the offset is 0.1 volts, if the neighbor memory cell was programmed to State B, then the offset will be 0.2 volts, and if the neighbor memory cell was programmed to State C, then the offset will be 0.3 volts. In other embodiments, other values or schemes can be used. The system has read the values stored in the neighboring word lines in steps 504 and 506 and, therefore, can determine which offsets to use. The system will determine a set of offsets for each of the neighboring word lines and then add the two offsets together. In this scheme, there are six possible offsets.

For example, assume a given memory cell has two neighbors. The first neighbor is programmed to State B. The second neighbor is programmed to State C. Then, the offsets from the first neighbor is 0.2 volts and the offset from the second neighbor is 0.3 volts. The total offset for that particular memory cell is 0.5 volts.

In other embodiments, there can be more of less than six potential offsets. In some implementations, the offsets may include a zero volt offset. For example, zero volt offset can be used when the neighboring memory cells remains in state E.

In step 602 of FIG. 15A, those memory cells that are not to receive any offsets store the previously read data from step 502. For example, if a memory cell has neighbors that are in State E, no offsets (or 0v Offsets) are used. In step 604, a read process is performed using the first offset with the read points. For example, the process of FIG. 14 can be performed. However, instead of using Vra, Vrb, and Vrc as read compare points, the read process uses Vra+first offset, Vrb+first offset, and Vrc+first offset. In step 606, data for the bit lines associated with the first offset is stored. That is, those memory cells that have one neighbor in State E and another neighbor in State A will have the data stored from step 604. In step 608, a read process is performed using the second set of offsets with the read compare points. For example, the process of FIG. 14 will be used with Vra+second offset, Vrb+second offset, and Vrc+second offset for the read compare points. In step 610, the bit lines associated with the second offset will store the data from step 608. For example, those memory cells that have one neighbor in State E and another neighbor in State B, or both neighbors in State A, will have stored the data from step 608. In step 612, a read process performed using the third offset with the read compare points. In step 614, data is stored for those bit lines associated with the third offset. In step 616, the read process is performed using the fourth offset with the read compare points. In step 618, data from step 616 is stored for those bit lines associated with the fourth offset. In step 620, the read process performed using the fifth offset with the read compare points. In step 622, data is stored for those bit lines associated with the fifth offset. In step 624, a read process is performed using the sixth offset with the read compare points. In step 626, data from step 624 is stored for those bit lines that are associated with the sixth offset. In one example, the first offset is 0.1 volts, the second offset is 0.2 volts, the third offset is 0.3 volts, the fourth offset is 0.4 volts, the fifth offset is 0.5 volts, and the sixth offset is 0.6 volts. More information about compensating for coupling can be found in U.S. patent application Ser. No. 11/099,133, filed Apr. 5, 2005, "Compensating for Coupling During Read Operations On Non-Volatile Memory," by Jian Chen, incorporated herein by reference in its entirety.

Figure 15B:
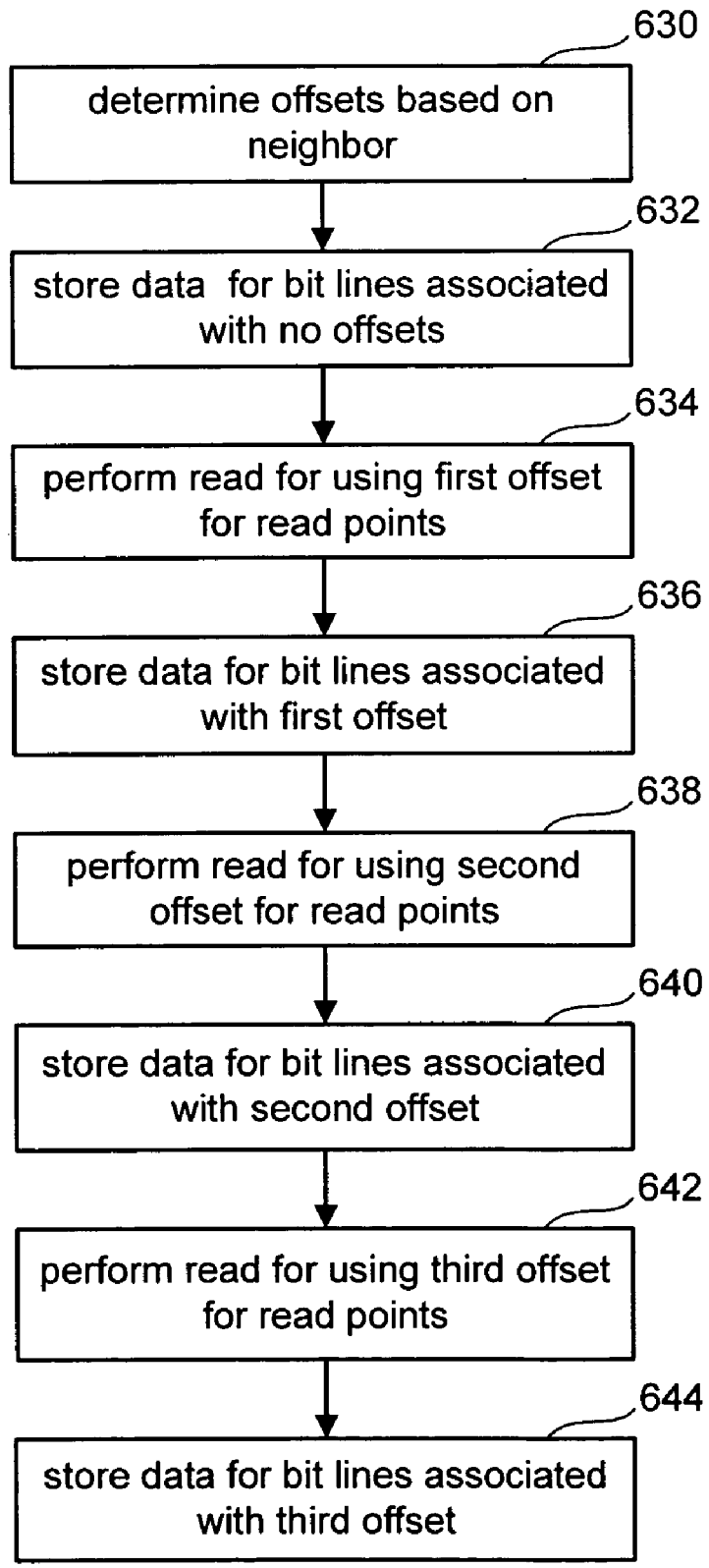
FIG. 15B is a flow chart describing one embodiment of a process for reading memory cells on a word line, using offsets to compensate for coupling.

The process of FIG. 15A is performed when there is potential coupling from two neighbors. If it is determined in step 508 that there is only potential coupling from one neighbor, then in step 514 the process of FIG. 15B will be performed. In step 630, the system will determine the offsets based on the one neighbor. In step 632, previously read data for those bit lines associated with no offsets is stored in step 632. In step 634, a read process is performed using the first offsets with the read compare points. In step 636, data for those bit lines associated with the first offset is stored. In step 638, a read process is performed using the second offset with the read compare points. In step 640, data for those bit lines associated with the second offset is stored. In step 642, a read process is performed using the third offset with the read/compare points. In step 644, data for those bit lines associated with the third offset is stored.

In another embodiment, rather than storing time stamps, the timing information will store in indication as to whether the particular page was programmed after or potentially before data on the neighboring word lines (or other neighbors). The reason the information only tells whether the page was written potentially before is because it is possible that the page was written while the neighbor was erased and that the neighbor was never written.

Figure 16:
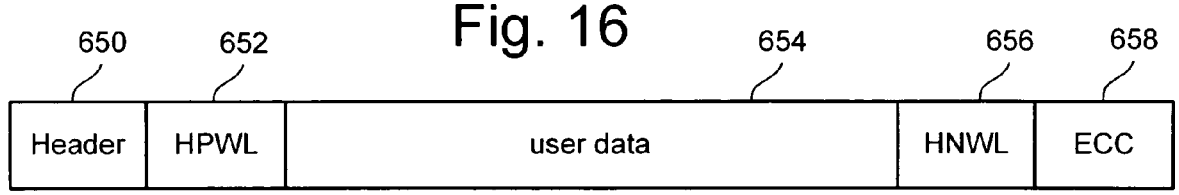
FIG. 16 is a block diagram depicting one page (or other unit) of data.

FIG. 16 provides another example of a page of data. The depicted page includes header 650, timing information 652, user data 654, timing information 656 and ECC 658. Timing information 652 provides history with respect to a previous word line (History Previous Word Line—HPWL). Timing information 656 provides history with respect to the next word line (History Next Word Line—HNWL). With respect to timing information 652 and 656, the use of the terms previous and next is not meant to describe time or order. Rather, previous or next is used to identify two different neighbors. For example, looking back at FIG. 5, word line WL2 has at least two neighbors: WL3, and WL1. For purposes of notation only, the neighbor word line closest to the source will be referred to as the previous word line and the neighbor word line closest to the drain will be referred to as the next word line. Thus, for WL1, the previous word line is WL1 and the next word line is WL2. The technology described herein for determining the potential for coupling and compensating when appropriate can be used with many different programming schemes, including a programming scheme that programs data in an order that is not predefined. That is, in some embodiments words lines are programmed from WL0 to WL3. In other embodiments, the system can randomly choose a word line and program the word lines in any order. The technology described herein can work with either embodiment.

FIG. 17 is a chart which describes the data values that can be stored in HPWL 652 and HNWL 656. In one embodiment, the data stored includes 2 bits: 11, 10, and 00. If HPWL 652 or HNWL 656 stores 11, then the page, sector or word line storing the history is erased. If HPWL 652 or HNWL 656 store 10, then the word line storing that history value has been programmed before the respective neighbor word line. If HPWL 652 or HNWL 656 stores 00, then the respective neighboring word line was programmed before the word line storing the history.

Figure 18:
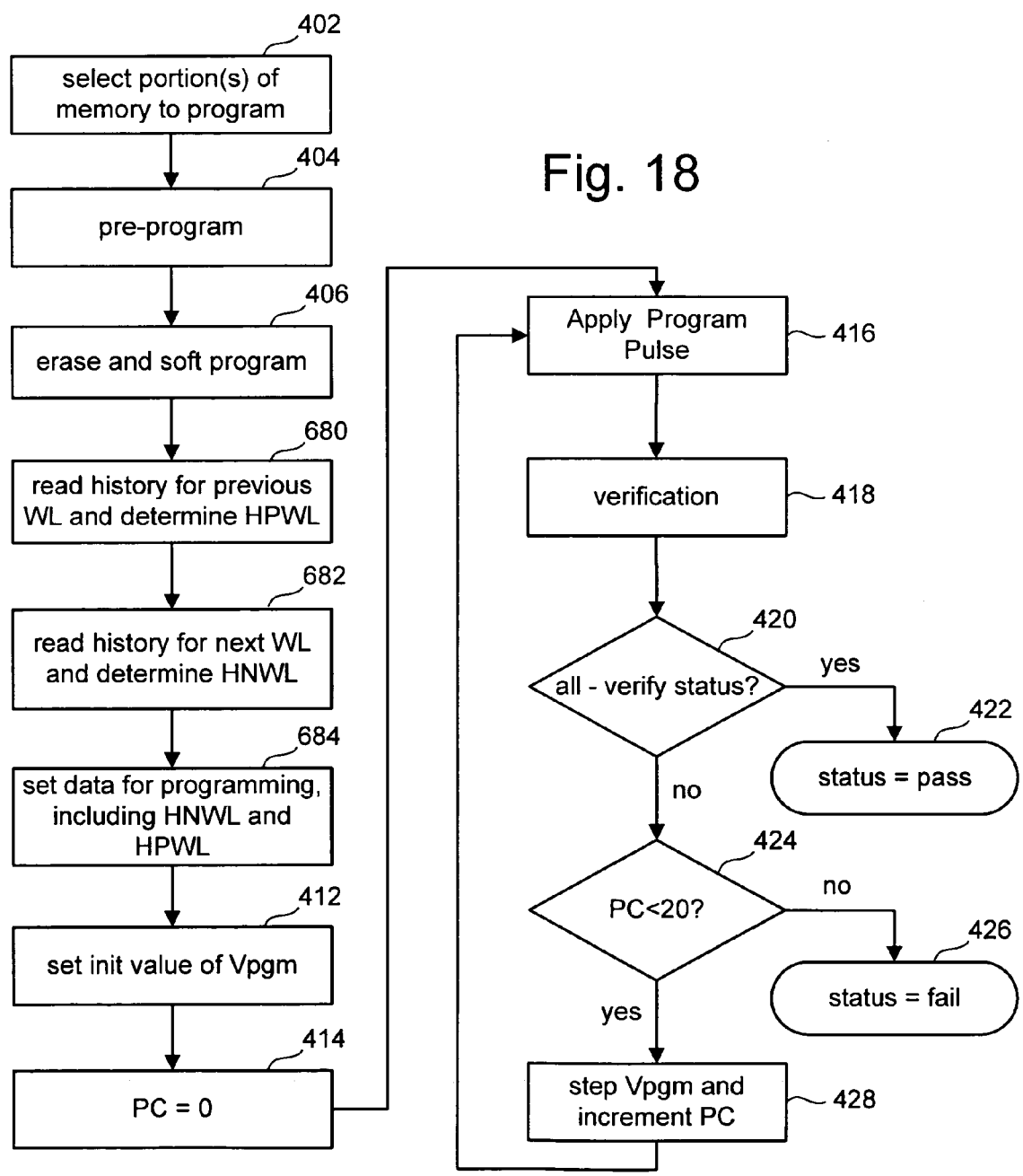
FIG. 18 is a flow chart describing one embodiment of a process for programming non-volatile memory.

FIG. 18 is a flowchart describing one embodiment of a process for programming a page depicted in FIG. 16. Steps 402-406 of FIG. 18 are the same as in FIG. 12. Step 680 includes reading the history for the previous word line and determining HPWL. For example, if word line WL2 of FIG. 5 is being programmed, then the previous word line is WL1. Step 680 will include looking at HNWL 656 for WL1 to see whether WL1 is erased (HNWL=11) or programmed (e.g. HNWL=10). Based on HNWL for WL1, the system will determine HPWL 652 for WL2. At step 682, the system will read the history for the next word line and determine HNWL. For example, when writing to WL2 of FIG. 5, the system will first read HPWL of word line WL3 and based thereon, determine what value should be stored in HNWL for word line WL2. The data for programming header 650, HPWL 652, user data 654, HNWL 656 and EC 658 are stored in the appropriate latches for each of the bit lines in step 684. Steps 412-428 of FIG. 17 are the same as in FIG. 12.

FIG. 19 is a flow chart describing one embodiment of the process for reading the history information from the next or previous word line and determining the appropriate HPWL or HNWL. For example, FIG. 19 provides one embodiment of steps 680 or 682. At step 700, a read process is performed by applying voltage Vra to the appropriate word line. At step 702, the bit lines are sensed to determine whether the memory cell turned on or not. Step 702 need only be performed on those memory cells that are storing the history value (HPWL or HNWL). In other embodiments, step 702 is performed on all (or a different bigger set of) memory cells connected to a word line. Note that if the history value is 11 (State E), then the memory cells will turn on. Otherwise, the memory cells storing the history will not turn on in response to the Vra. If the memory cells storing the history turn on, then it is assumed that the memory cells connected to the neighbor word line are erased; therefore, the current memory cells being programmed are being programmed potentially before the neighbor word line is being programmed. If the memory cells storing the history do not turn on, then it is assumed that the memory cells on the neighbor word line are already programmed and the current word line is being programmed subsequent to the neighbor word line being programmed. Results from step 702 are stored in step 704. Based on whether the memory cells storing the history information turned on or off, (step 706), the appropriate value is stored in the history for the current word line. If the history of the neighbor is 11, then in step 710 the value 10 is stored in the appropriate history value for the current word line indicating that the current word line is programmed before the neighbor. If the history value for the neighbor is 10, then 00 is stored for the history in the current word line to indicate that the current word line is programmed after the neighbor.

FIG. 20 is a flow chart describing one embodiment of a read process for reading data programmed according to the process of FIG. 18. Note that FIG. 20 is another embodiment for the process of FIG. 10. In step 800 of FIG. 20, a request to read data is received. In step 802, a read process is performed for the word line, without using any offsets. For example, the process of FIG. 14 is performed. In step 804, the history is accessed for the word line being read. Note that in one embodiment, the history data is read in step 802 as part of the read process of the entire page. That data is then accessed by a processor, state machine, etc. at step 804. In other embodiments, the history data can be accessed before or after step 802. If either HNWL or HPWL is 11 (step 806), then it's assumed that the pages has erased data and at step 808 the erased data is reported. If both HNWL and HPWL are 00, then it is assumed that the current page being read was programmed after both neighbors. Therefore, at step 810, the data is reported without compensating for coupling. If HNWL=00 and HPWL=10 (step 812), then additional read operations are performed that compensate for coupling from the previous neighbor in step 814. If HNWL=10 and HPWL=10, then additional read operations are performed that compensate for coupling from both neighbors in step 818. If HNWL=10 and HPWL=00, then additional read operations are performed that compensate for coupling from the next neighbor in step 816.

FIG. 21 is a flow chart describing one embodiment of a process for performing additional read operations that compensate for coupling from one neighbor. For example, the process of FIG. 21 can be performed as part of step 814 or step 816 of FIG. 20. In step 904, data is read from the neighboring word line using the read compare point Vra provided at the control gate or word line. In step 906, it is determined whether the entire word line or page is erased. If all of the memory cells are in State E, then all of the memory cells will turn on in response to Vra. If all the memory cells are erased (step 906), then data is reported without performing any compensation for coupling from the neighbor word line at step 908. If the neighboring word line is not erased (step 906), then the read process continues with doing a read operation using read compare point Vrb and a read operation using compare point Vrc in step 910. Based on the three read operations, the data stored in the neighbor can be determined (see discussion of FIG. 14). After step 910, an additional read process is performed that compensates for potential coupling in light of the data stored in the neighbor. For example, the process of FIG. 15B can be performed.

FIG. 22 is a flow chart describing one embodiment of a process for performing additional read operations that take into account coupling from two neighbors. For example, the process of FIG. 22 can be performed as part of step 818 of FIG. 20. In step 930, both neighbor word lines are read using the read compare point Vra. If both neighbors are determined to be erased (step 932), then at step 934 the data is reported without compensating for coupling. If one neighbor is determined to be erased (e.g., one neighbor word line or page has all of its memory cells turn on, while the other neighbor does not have all its memory cells turned on in response to Vra), then at step 950 that one neighbor will be the subject of read processes performed using the read compare points of Vrb and Vrc (similar to step 910 of FIG. 21). In step 952, additional read processes are performed that compensate for potential coupling at step 952 (similar to step 912 of FIG. 21). If at step 932 it is determined that neither neighbor is erased, then at step 936 both neighbors will have read processes performed using the read compare points of Vrb and Vrc. At step 938, additional read processes will be performed that compensate for potential coupling from both word lines, and that data will be reported. In one embodiment, step 938 includes performing a process of FIG. 15A.

The technology described herein for detecting the potential for coupling and compensating for that coupling can be applied to detecting the potential for other types of errors and (optionally) compensating for those errors.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A non-volatile storage system, comprising:
   a plurality of non-volatile storage elements; and
   one or more managing circuits in communication with said non-volatile storage elements, said one or more managing circuits access stored timing information that is customized for a set of data stored in said plurality of non-volatile storage elements and read said set of data from said plurality of non-volatile storage elements including selectively compensating for one or more potential errors in said set of data based on said timing information, said one or more potential errors are due to potential coupling between said one or more non-volatile storage elements and one or more neighboring non-volatile storage elements.

2. A non-volatile storage system according to claim 1, wherein:
   said set of data is stored in a subset of said plurality of non-volatile storage elements, said subset has neighboring non-volatile storage elements;
   said one or more managing circuits read first time data for a word line associated with said subset and read second time data for a word line associated with said neighboring non-volatile storage elements; and
   said one or more managing circuits compare said first time data to said second time data and determine whether there is a potential for errors based on said comparing.

3. A non-volatile storage system according to claim 1, wherein:
   said selectively compensating includes choosing whether or not to use a voltage offset and how much of said voltage offset to use during a read process based on said neighboring non-volatile storage elements.

4. A non-volatile storage system according to claim 1, wherein:
   said set of data is stored in a subset of said plurality of non-volatile storage elements, said subset has a first set of neighbors and a second set of neighbors;
   said one or more managing circuits read data from memory elements connected to a first word line, said memory elements include said subset and additional non-volatile storage elements storing said timing information, said timing information includes a first value and a second value, said first value indicates timing of programming said subset with respect to a first set of neighbors, said second value indicates timing of programming subset with respect to a second set of neighbors;
   said one or more managing circuits report said data without compensating for one or more potential errors if said first value indicates that subset was programmed after said first set of neighbors and said second value indicates that said subset was programmed after said second set of neighbors; and
   said one or more managing circuits report said data after compensating for one or more potential errors if said first value indicates that said subset was programmed potentially prior to said first set of neighbors or said second value indicates that said subset was programmed potentially prior to said second set of neighbors.

5. A non-volatile storage system according to claim 1, wherein:
   said one or more managing circuits program said set of data to a subset of said plurality of non-volatile storage elements including programming said timing information; and
   said programming said set of data includes reading neighbor timing information and determining said timing information that is customized for said set of data based on said neighbor timing information.

6. A non-volatile storage system according to claim 5, wherein:
   said one or more non-volatile storage elements are multi-state non-volatile storage elements;
   said reading neighbor timing information includes performing a read operation at one reference voltage level; and
   said determining said timing information is based on said read operation at one reference voltage level.

7. A non-volatile storage system according to claim 1, wherein:
   said set of data is stored in a subset of said plurality of non-volatile storage elements, said subset has neighboring non-volatile storage elements; and
   said selectively compensating includes performing a first compensation process for coupling between said subset and said neighboring non-volatile storage elements if said timing information indicates that said subset was programmed prior to programming said neighboring non-volatile storage elements and reading without performing a first compensation process if said timing information indicates that said subset was not programmed prior to programming said neighboring non-volatile storage elements.

8. A non-volatile storage system according to claim 1, wherein:
   said timing information can include any of an absolute time, a relative time, or an indication of order of programming.

9. A non-volatile storage system according to claim 1, wherein:
   said set of data includes a page of data;
   said set of data is stored in a subset of said plurality of non-volatile storage elements connected to a first word line; and
   said one or more potential errors are due to coupling between said subset and one or more non-volatile storage elements connected to word lines that neighbor said first word line.

10. A non-volatile storage system according to claim 1, wherein:
    said stored timing information is accessed concurrently while reading said set of data.

11. A non-volatile storage system according to claim 1, wherein:

said one or more managing circuits include one or more of a state machine, a decoder, sense circuits and a controller.

12. A non-volatile storage system according to claim 1, wherein:
said plurality of non-volatile storage elements are NAND flash memory devices.

13. A non-volatile storage system according to claim 1, wherein:
said plurality of non-volatile storage elements are multi-state flash memory devices.

14. A non-volatile storage system according to claim 1, wherein:
said plurality of non-volatile storage elements include floating gates.

15. A non-volatile storage system, comprising:
a plurality of non-volatile storage elements;
a set of word lines connected to said non-volatile storage elements; and
one or more managing circuits in communication with said non-volatile storage elements and said set of wordlines, said one or more managing circuits program data to said non-volatile storage elements in a word line order that is not predefined, said programming includes storing timing information for said data, said one or more managing circuits read said data from said non-volatile storage system including selectively compensating for coupling between non-volatile storage elements if said stored timing information indicates that neighboring non-volatile storage elements were potentially programmed later in time than non-volatile storage elements storing said data.

16. A non-volatile storage system according to claim 15, wherein:
said programming includes reading a timing value for said neighboring non-volatile storage elements and determining said timing information based on said timing value for said neighboring non-volatile storage elements.

17. A non-volatile storage system according to claim 16, wherein:
said neighboring non-volatile storage elements are multi-state non-volatile storage elements; and
said reading said timing value for said neighboring non-volatile storage elements includes only needing to perform a read process at one read compare point to provide necessary data for said determining said timing information based on said timing value for said neighboring non-volatile storage elements.

18. A non-volatile storage system according to claim 15, wherein said one or more managing circuits program using a method comprising:
reading a first timing value for a first set of said neighboring non-volatile storage elements;
reading a second timing value for a second set of said neighboring non-volatile storage elements;
determining a third timing value based on said first timing value, said third timing value indicates programming order relative to said first set of said neighboring non-volatile storage elements;
determining a fourth timing value based on said second timing value, said fourth timing value indicates programming order relative to said second set of said neighboring non-volatile storage elements, said timing information includes said third timing value and said fourth timing value; and programming a unit of information, said unit of formation includes said data and said third timing value and said fourth timing value.

19. A non-volatile storage system according to claim 15, wherein:
said plurality of non-volatile storage elements are NAND flash memory devices.

20. A non-volatile storage system according to claim 15, wherein:
said plurality of non-volatile storage elements are multi-state flash memory devices.

21. A non-volatile storage system, comprising:
non-volatile storage elements; and
one or more managing circuits in communication with said non-volatile storage elements, said one or more managing circuits capable of receiving a request to read data and accessing timing information that is customized for said data in response to said request, said one or more managing circuits determine whether there is a potential for coupling between non-volatile storage elements based on said timing information, a subset of said non-volatile storage elements store said data, said one or more managing circuits read said data including compensating for coupling between non-volatile storage elements if it is determined based on said timing information that there is potential for coupling between non-volatile storage elements.

22. A non-volatile storage system according to claim 21, wherein:
said data is stored in a subset of said non-volatile storage elements, said subset has neighboring non-volatile storage elements;
said one or more managing circuits read first time data for a word line associated with said subset and read second time data for a word line associated with said neighboring non-volatile storage elements; and
said one or more managing circuits compare said first time data to said second time data and determine whether there is a potential for coupling based on said comparing.

23. A non-volatile storage system according to claim 21, wherein:
said data is stored in a subset of said non-volatile storage elements, said subset has a first set of neighbors and a second set of neighbors;
said one or more managing circuits read data from memory elements connected to a first word line, said memory elements include said subset and additional non-volatile storage elements storing said timing information, said timing information includes a first value and a second value, said first value indicates timing of programming said subset with respect to a first set of neighbors, said second value indicates timing of programming subset with respect to a second set of neighbors;
said one or more managing circuits report said data without compensating for coupling if said first value indicates that subset was programmed after said first set of neighbors and said second value indicates that said subset was programmed after said second set of neighbors; and
said one or more managing circuits report said data after compensating for coupling if said first value indicates that said subset was programmed potentially prior to said first set of neighbors or said second value indicates that said subset was programmed potentially prior to said second set of neighbors.

24. A non-volatile storage system according to claim 21, wherein:
said one or more managing circuits program said data to said non-volatile storage elements including reading neighbor timing information associated with a set of neighboring non-volatile storage elements, determining said timing information that is customized for said data based on said neighbor timing information; and storing said timing information that is customized for said data.

25. A non-volatile storage system according to claim 21, wherein:
said non-volatile storage elements are NAND flash memory devices.

26. A non-volatile storage system according to claim 21, wherein:
said non-volatile storage elements are multi-state flash memory devices.

27. A non-volatile storage system, comprising:
one or more non-volatile storage elements connected to a first word line;
one or more non-volatile storage elements connected to a second word line; and
means for receiving a request to read data stored in a predefined unit of data, said predefined unit of data is stored in said one or more non-volatile storage elements connected to said first word line, said predefined unit of data includes a first history data value that indicates order of programming of said unit of data with respect to said second word line;
means for reading said first history data value;
means for reading said data from said one or more non-volatile storage elements connected to said first word line including performing a first compensation process for coupling between said one or more non-volatile storage elements connected to said first word line and one or more non-volatile storage elements connected to said second word line if said first history data value indicates that said unit of data was programmed prior to potential programming of said second word line; and
means for reading said data from said one or more non-volatile storage elements connected to said first word line without performing a first compensation process if said first history data value does not indicate that said unit of data was programmed prior to said second word line.

28. A non-volatile storage system according to claim 27, wherein:
said unit of data is a page of data;
first history data value is a two bit value; and
said first compensation process includes performing read processes using offsets.

29. A non-volatile storage system according to claim 27, wherein:
said one or more non-volatile storage elements connected to said first word line and said one or more non-volatile storage elements connected to said second word line are multi-state flash memory elements.

* * * * *